(12) United States Patent
Lunsman et al.

(10) Patent No.: US 10,765,032 B2
(45) Date of Patent: Sep. 1, 2020

(54) FLOATING LIQUID COOLED HEAT TRANSFER SOLUTION

(71) Applicant: Hewlett Packard Enterprise Development LP, Houston, TX (US)

(72) Inventors: Harvey John Lunsman, Chippewa Falls, WI (US); Russell Eric Stacy, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 9 days.

(21) Appl. No.: 15/339,704

(22) Filed: Oct. 31, 2016

(65) Prior Publication Data

US 2017/0135246 A1    May 11, 2017

Related U.S. Application Data

(60) Provisional application No. 62/252,946, filed on Nov. 9, 2015.

(51) Int. Cl.
*H05K 7/20* (2006.01)

(52) U.S. Cl.
CPC .............................. *H05K 7/20263* (2013.01)

(58) Field of Classification Search
None
See application file for complete search history.

(56) References Cited

U.S. PATENT DOCUMENTS

| 5,513,070 | A | 4/1996 | Xie et al. | |
|---|---|---|---|---|
| 6,916,122 | B2 * | 7/2005 | Branch | G02B 6/4201 |
| | | | | 385/92 |
| 7,224,582 | B1 * | 5/2007 | Saturley | G06F 1/20 |
| | | | | 361/679.54 |
| 7,625,223 | B1 | 12/2009 | Fogg | |
| 7,764,504 | B2 * | 7/2010 | Phillips | G02B 6/4246 |
| | | | | 165/80.2 |
| 8,535,787 | B1 | 9/2013 | Lima | |

(Continued)

FOREIGN PATENT DOCUMENTS

WO    WO 2017/083383    5/2017

OTHER PUBLICATIONS

PCT Application No. PCT/US2016/061131 International Search Report and Written Opinion dated Jan. 6, 2017.
(Continued)

*Primary Examiner* — Courtney L Smith

(57) ABSTRACT

The present disclosure relates to an apparatus and a method for cooling electronic components. An apparatus of the presently claimed invention includes a connector and an electronic component that plugs into the connector. The electronic component contacts a heat sink, where the heat sink moves in an upward direction as the electronic component is plugged into the connector. Soft thermal pads located between the heat sink and liquid cooling tubes/pipes compress as the heat sink moves upward. When compressed, the thermal pads contact the heat sink and the liquid cooling tubes/pipes. Heat is then transferred from the electronic component through the heat sink, through the thermal pads, through the coolant tubes, and into liquid contained within the liquid coolant tubes.

20 Claims, 4 Drawing Sheets

FIG. 4

(56) References Cited

U.S. PATENT DOCUMENTS

| | | | |
|---|---|---|---|
| 2005/0195565 A1* | 9/2005 | Bright | H04B 1/036 361/688 |
| 2005/0195571 A1* | 9/2005 | Bulman-Fleming | H05K 7/20509 361/704 |
| 2006/0221560 A1 | 10/2006 | Seki | |
| 2006/0285806 A1* | 12/2006 | Ahrens | G02B 6/4246 385/92 |
| 2006/0291171 A1* | 12/2006 | Ahrens | G02B 6/4292 361/716 |
| 2007/0058347 A1* | 3/2007 | Tsai | H01L 23/427 361/703 |
| 2008/0060373 A1* | 3/2008 | Campbell | H05K 7/20772 62/259.2 |
| 2008/0163631 A1 | 7/2008 | Campbell et al. | |
| 2008/0285236 A1 | 11/2008 | Phillips et al. | |
| 2009/0213541 A1 | 8/2009 | Butterbaugh et al. | |
| 2009/0296350 A1 | 12/2009 | Oki et al. | |
| 2013/0032324 A1* | 2/2013 | Aldridge | F28F 3/02 165/185 |
| 2013/0271918 A1* | 10/2013 | Neville Hughes | H05K 7/20309 361/702 |
| 2014/0160679 A1* | 6/2014 | Kelty | H05K 7/20672 361/700 |
| 2014/0321061 A1* | 10/2014 | Moore | H05K 3/301 361/709 |
| 2014/0328561 A1* | 11/2014 | Tanaka | G02B 6/42 385/88 |
| 2015/0013936 A1* | 1/2015 | Mack | F28D 15/0275 165/53 |
| 2015/0029667 A1* | 1/2015 | Szczesny | F28D 15/0275 361/700 |
| 2016/0093996 A1* | 3/2016 | Phillips | H01R 24/60 439/487 |
| 2017/0192185 A1* | 7/2017 | Kelty | G02B 6/4269 |

OTHER PUBLICATIONS

PCT/US16/61131, Floating Liquid Cooled Heat Transfer Solution, filed Nov. 9, 2016.

\* cited by examiner

FLOATING LIQUID COOLED HEAT TRANSFER SOLUTION

CROSS REFERENCE TO RELATED APPLICATIONS

This application claims the priority benefit of U.S. provisional patent application No. 62/252,946 filed Nov. 9, 2015, entitled "Floating Liquid Cooled Heat Transfer Solution," the disclosure of which is incorporated herein by reference.

BACKGROUND OF THE INVENTION

Field of the Invention

The present invention is generally directed to cooling electronic devices. More specifically, the present invention cools electronic components using liquid coolant tubes.

Description of the Related Art

Conventional approaches to cooling electronic devices use large heat sinks that are cooled by blowing air over and around the heat sinks and by using heat pipes that channel heat to a different location that has better airflow. Air cooled heat sinks and heat pipes require a significant amount of space to cool electronics, this is because both conventional air cooled heat sinks and heat pipes require the movement of a significant amount of air to cool electronics. Heat pipes and large heat sinks are also expensive.

Because modern computer systems and blade serves today maximize electronic component density by eliminating empty space, modern computer systems have little or no space available to fit large heat sinks or heat pipes. As such, large heat sinks and heat pipes do not provide cooling sufficient to cool electronics adequately. What is needed are more efficient cooling techniques and apparatuses that cool electronics with little or no air flow.

SUMMARY OF THE PRESENTLY CLAIMED INVENTION

The presently claimed invention relates to an apparatus and a method for cooling electronic components. An apparatus of the presently claimed invention includes a connector and an electronic component that plugs into the connector. The electronic component contacts a heat sink, where the heat sink moves in an upward direction as the electronic component is plugged into the connector. Soft thermal pads located between the head sink and liquid cooling tubes/pipes compress as the heat sink moves upward. When compressed, the thermal pads contact the heat sink and the liquid cooling tubes/pipes. Heat is then transferred from the electronic component through the heat sink, through the thermal pads, through the coolant tubes, and into liquid contained within the liquid coolant tubes.

A method of the presently claimed invention cools an electronic component by transferring heat from electronic component to a floating heat sink. Heat is then transferred from the floating heat sink through one or more soft thermal transfer pads. Heat then transfers through the liquid cooling tubes/pipes and into liquid contained within the liquid cooling tubes/pipes. Initially when the electronic component is inserted into a connector, the floating heat sink moves a first direction compressing the soft thermal pads between the floating heat sink and the liquid cooling tubes/pipes.

DETAILED DESCRIPTION

The present disclosure relates to an apparatus and a method for cooling electronic components. An apparatus of the presently claimed invention includes a connector and an electronic component that plugs into the connector. The electronic component contacts a heat sink, where the heat sink moves in an upward direction as the electronic component is plugged into the connector. Soft thermal pads located between the heat sink and liquid cooling tubes/pipes compress as the heat sink moves upward. When compressed, the thermal pads contact the heat sink and the liquid cooling tubes/pipes. Heat is then transferred from the electronic component through the heat sink, through the thermal pads, through the coolant tubes, and into liquid contained within the liquid coolant tubes. Apparatus consistent with the present disclosure may also include one or more springs. The apparatus may include a plurality of springs that may be located adjacent to the compressible soft thermal pads. The springs may also compress as the heat sink moves forward.

Figure 1:
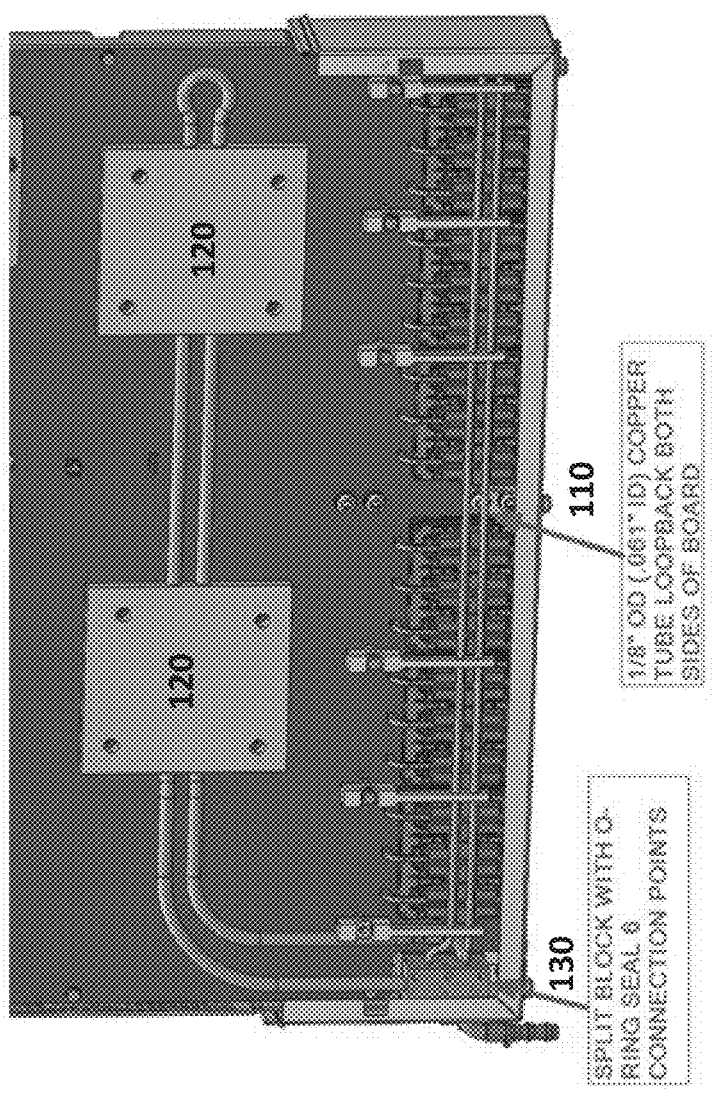
FIG. 1 illustrates an electronic assembly including electronic components and cooling tubes.

FIG. 1 illustrates an electronic assembly including electronic components and cooling tubes. FIG. 1 illustrates a ⅛ inch copper tube 110 (coolant tubes or pipes) running next to various components 120 that may include a heat sink. The coolant tubes used may be flattened such that they consume a limited amount of cross sectional area.

FIG. 1 also includes a split block connection point 130 that may include O-rings where a liquid coolant may be introduced to and removed from the electronic assembly. FIG. 1 also includes low profile aluminum heat sinks that may use Bergquist V-0 ultra-soft gap pad materials to transfer heat. Heat sinks of the present disclosure may be made of other materials besides aluminum, including, yet not limited to copper, copper coated silver, or other materials known to transfer heat readily. Heat transfer pads may be any available compressible heat transfer pad.

Figure 2:
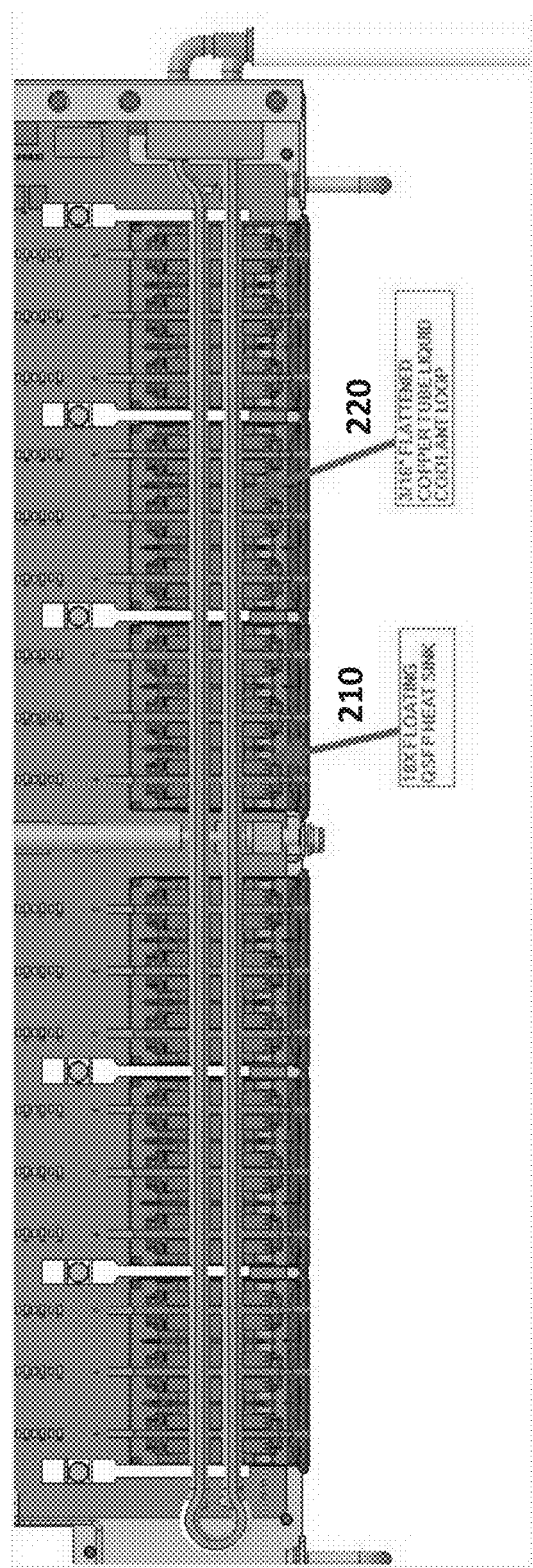
FIG. 2 illustrates an electronic assembly that includes floating quad small form factor floating heat sinks and liquid coolant tubes.

FIG. 2 illustrates an electronic assembly that includes floating quad small form factor floating heat sinks 210 and liquid coolant tubes 220. The quad small form factor floating heat sinks 210 may include soft gap heat transfer pads. When an electronic component is inserted into a connector, they may move up and compress the heat transfer pads against the coolant tubes 220. Electronic components that may be inserted into such a connector include, yet are not limited to a high speed active optical transceiver and an active quad small form factor pluggable electronic device.

Figure 3:
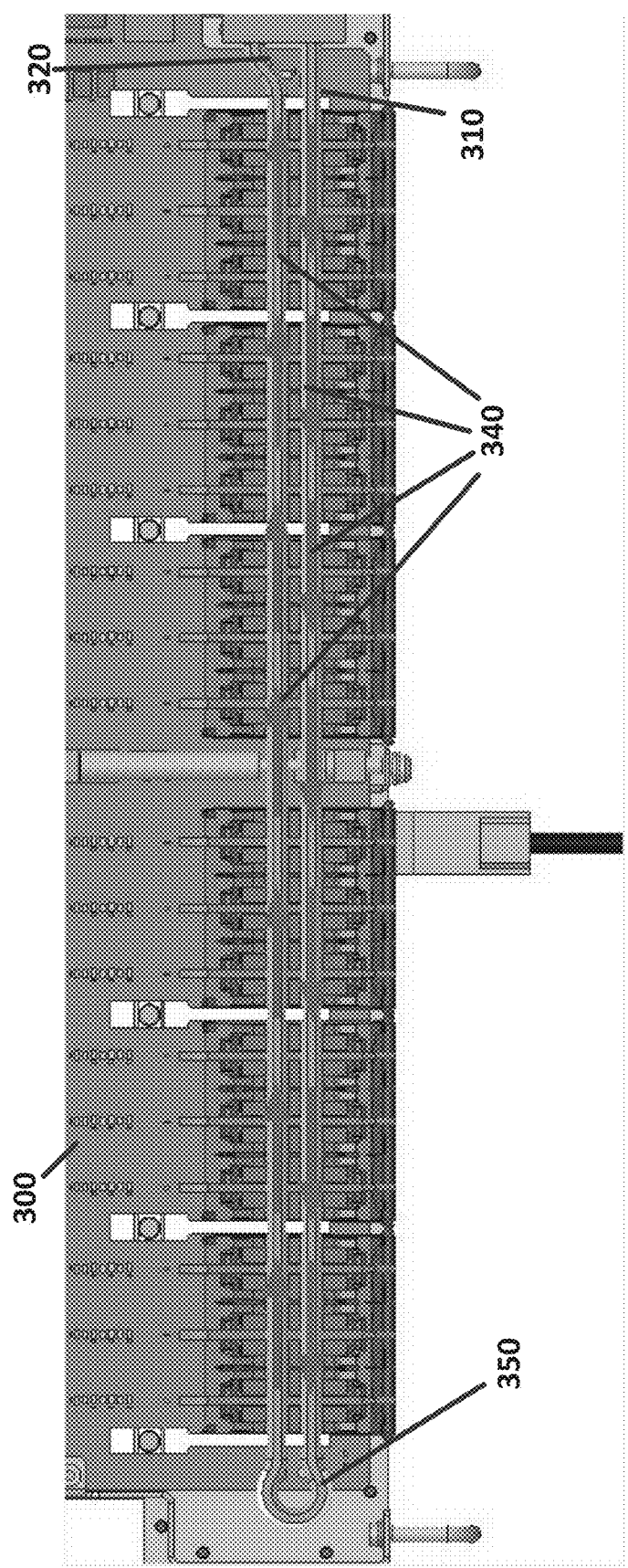
FIG. 3 illustrates the flow of liquid through the coolant tubes in an electronic assembly.

FIG. 3 illustrates the flow of liquid through the coolant tubes in an electronic assembly. Notice that liquid coolant moves from the right bottom portion 310 of the electronic assembly of FIG. 3, to the left, and then returns to the right side 320 of the electronic assembly 300. Arrows 320 in FIG. 3 illustrate the flow of coolant through the cooling tubes 350. Here again the cooling tubes 350 may be of a small diameter (¹/₁₆ of an inch) and may be flattened to reduce the cross sectional area consumed by the cooling tubes 350. Coolant liquid may flow into right bottom porting 310 and out the right side 320 of the electronic assembly 300. The coolant liquid may then flow to a chiller that transfer's heat from the liquid, cooling the liquid. Since liquid cooling is much more efficient than air cooling, electronic components contained within such an assembly 300 will require little or no air movement to cool the electronic components contacting the heat sink.

Figure 4:
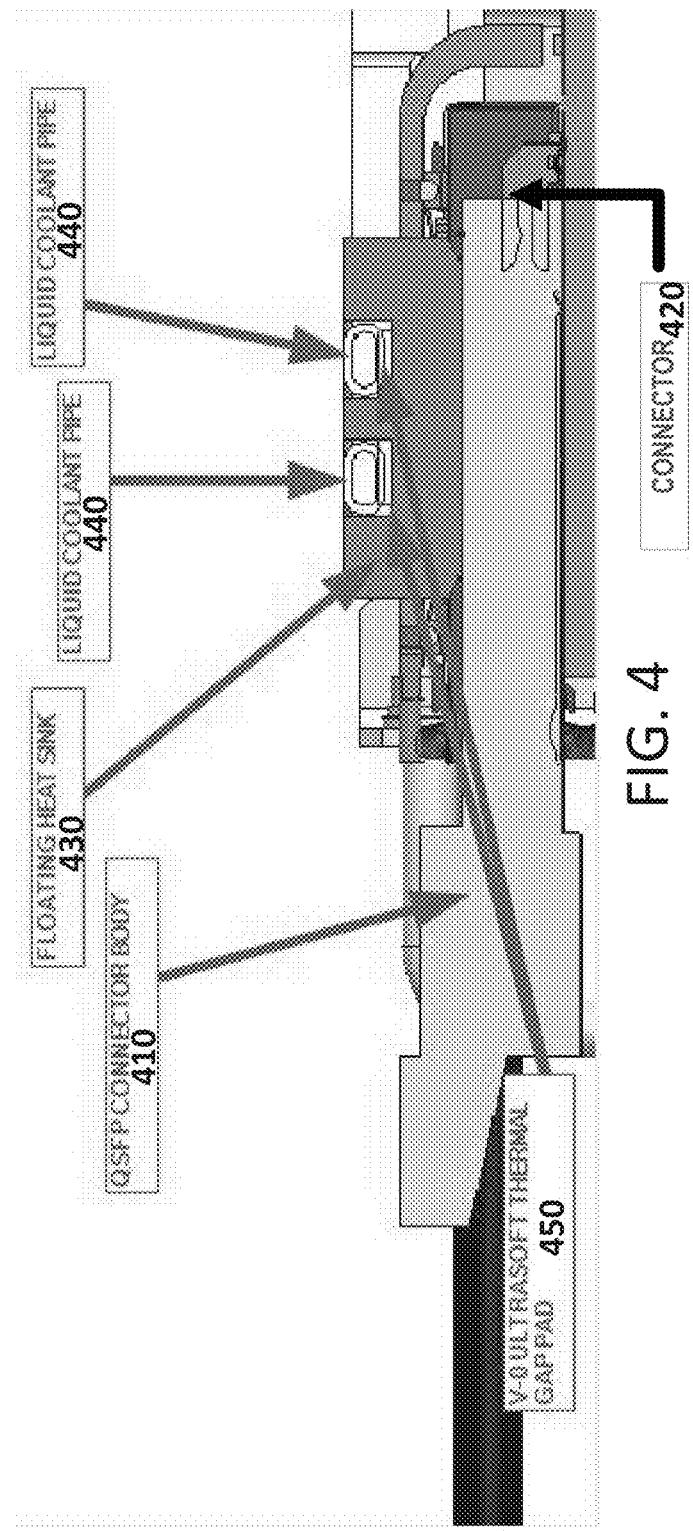
FIG. 4 illustrates a semi-cross sectional side view that may be used to cool electronic components

FIG. 4 illustrates a semi-cross sectional side view that may be used to cool electronic components. FIG. 4 includes a quad small form factor pluggable (QSFP) connector body 410 that plugs into a connector 420. FIG. 4 also includes a floating heat sink 430, liquid coolant tubes/pipes 440 and ultra-soft thermal gap pad 450. Notice that as the QSFP connector body 410 is plugged into the connector 420 that the QSFP connector body 410 contacts the floating heat sink 430. As the QSFP connector body 410 is slid into the connector, the floating heat sink 430 will be pressed upward compressing the ultra-soft thermal gap pads 450, and the gap pads 450 will contact the liquid cooling tubes/pipes 440. Notice also that the liquid cooling tubes/pipes 440 in FIG. 4 are flattened (they are oval shaped) and that they do not rise above the top of the floating heat sink 430. The Apparatus of FIG. 4 transfers heat from electronic components contained within the QSFP connector body 410 to the heat sink 430. Heat also transfers from the heat sink 430 to the cooling tubes/pipes 440 through the gap pads 450. When an electronic component, such as the QSFP of FIG. 4 is inserted into the connector 420, one or more springs (not illustrated) may also compress when the ultra-soft thermal gap pads 450 are compressed (i.e. when the floating heat sink moves upward).

Liquids that may be used in an apparatus consistent with the present disclosure include, yet are not limited to a water/glycol mixture, 3M Novec cooling liquids, 3M Fluorinert cooling liquids, or refrigerants. Refrigerants that may be used with apparatus consistent with the present disclosure include, yet are not limited to: R12, R22, R32, R100 series refrigerants (i.e. R115, R124, R125, R134, R134a, R142b, R143a, &R152a), T400 series refrigerants (i.e. R401A, R-404A, R406A, R407A, R407C, R408A, R409A, R410A, & R438A), R500 (i.e. R500 & R-502), R600 series refrigerants, R700 series refrigerants, or combination/blend thereof.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology, its practical application, and to enable others skilled in the art to utilize the technology in various embodiments and with various modifications as are suited to the particular use contemplated. It is intended that the scope of the technology be defined by the claim.

What is claimed is:

1. An apparatus comprising:
   a connector that is configured to have an electronic component plugged therein;
   a floating heat sink, wherein the electronic component contacts the floating heat sink and moves the floating heat sink in a first direction when the electronic component is plugged into the connector;
   at least one liquid cooling tube having an inlet opening and an outlet opening therethrough;
   a soft thermal transfer pad located between the floating heat sink and the at least one liquid cooling tube such that the soft thermal transfer pad is compressed by the floating heat sink and the at least one liquid cooling tube as a result of the floating heat sink moving in the first direction; and
   one or more springs that compress as the floating heat sink moves in the first direction.

2. The apparatus of claim 1, wherein the at least one liquid cooling tube is connected to a chiller that chills a liquid and provides the chilled liquid to the at least one liquid cooling tube.

3. The apparatus of claim 1, wherein the liquid includes at least one of water/glycol mixture, 3M Novec cooling liquids, 3M Fluorinert cooling liquids, a refrigerant, or a refrigerant blend.

4. A method comprising:
   providing the apparatus of claim 1 and the electronic component;
   plugging the electronic component into the connector and thereby causing the electronic component to contact the floating heat sink and move the floating heat sink in the first direction;
   flowing a liquid through the at least one liquid cooling tube.

5. The method of claim 4, wherein the at least one liquid cooling tube is connected to a chiller that chills the liquid and provides the chilled liquid to the at least one liquid cooling tube.

6. The method of claim 4, wherein the liquid includes at least one of water/glycol mixture, 3M Novec cooling liquids, 3M Fluorinert cooling liquids, a refrigerant, or a refrigerant blend.

7. The apparatus of claim 1, wherein the connector is a quad small factor pluggable (QSFP) compliant connector.

8. The apparatus of claim 1, wherein the electronic component is an optical transceiver.

9. The apparatus of claim 1, wherein the electronic component is a QSFP-compliant transceiver.

10. The apparatus of claim 1, wherein the soft thermal transfer pad comprises Bergquist V-0 ultra-soft gap pad materials.

11. The apparatus of claim 1, wherein the at least one liquid cooling tube is disposed such that a first portion of the at least one liquid cooling tube is adjacent to and parallel to a second portion of the at least one liquid cooling tube such that when a liquid is flowed through the at least one liquid cooling tube the liquid flows along a first direction in the first portion of the at least one liquid cooling tube and the liquid flows a second direction in the second portion of the at least one liquid cooling tube wherein the first direction is opposite that of the second direction.

12. The apparatus of claim 1, wherein the first direction is upwards.

13. The apparatus of claim 1 further comprising a spring disposed between the floating heat sink and the at least one liquid cooling tube.

14. The apparatus of claim 1, wherein the floating heat sink comprises at least one of aluminum and copper.

15. The apparatus of claim 1, wherein the at least one liquid cooling tube is compressible to a degree that the at least one liquid cooling tube is flattened when the electronic component is plugged into the connector.

16. An apparatus comprising:
   a connector that is configured to have an electronic component plugged therein;
   a floating heat sink, wherein the electronic component contacts the floating heat sink and moves the floating heat sink in a first direction when the electronic component is plugged into the connector;
   at least one liquid cooling tube having an inlet opening and an outlet opening therethrough;

a spring disposed between the floating heat sink and the at least one liquid cooling tube; and a soft thermal transfer pad located between the floating heat sink and the at least one liquid cooling tube such that the soft thermal transfer pad is compressed by the floating heat sink and the at least one liquid cooling tube as a result of the floating heat sink moving in the first direction.

17. The apparatus of claim 16, wherein the at least one liquid cooling tube is connected to a chiller that chills a liquid and provides the chilled liquid to the at least one liquid cooling tube.

18. The apparatus of claim 1, wherein the electronic component is an optical transceiver.

19. The apparatus of claim 16, wherein the at least one liquid cooling tube is disposed such that a first portion of the at least one liquid cooling tube is adjacent to and parallel to a second portion of the at least one liquid cooling tube such that when a liquid is flowed through the at least one liquid cooling tube the liquid flows along a first direction in the first portion of the at least one liquid cooling tube and the liquid flows a second direction in the second portion of the at least one liquid cooling tube wherein the first direction is opposite that of the second direction.

20. The apparatus of claim 16, wherein the at least one liquid cooling tube is compressible to a degree that the at least one liquid cooling tube is flattened when the electronic component is plugged into the connector.

* * * * *